United States Patent [19]

Chaussy et al.

[11] Patent Number: 4,558,512

[45] Date of Patent: Dec. 17, 1985

[54] PROCESS FOR MAKING A CONNECTION BETWEEN SUPERCONDUCTIVE WIRES AND TO A CONNECTION OBTAINED BY THIS PROCESS

[75] Inventors: Jacques Chaussy, Echirolles; Jean-Louis Genicon, Brigoud; Jean Mazuer, Voreppe; Jean Pilon, Grenoble; André Sulpice, Novalaise, all of France

[73] Assignee: Centre National de la Recherche Scientifique, Paris, France

[21] Appl. No.: 627,613

[22] Filed: Jul. 3, 1984

[30] Foreign Application Priority Data

Jul. 5, 1983 [FR] France .................. 83 11147

[51] Int. Cl.⁴ ............................... H01L 39/24
[52] U.S. Cl. ...................... 29/599; 174/126 S; 174/128 S; 174/15 C; 174/84 C; 29/871; 29/872
[58] Field of Search ............... 29/599, 871, 872, 518; 174/84 C, 15 C, 15 S, 126 S, 128 S

[56] References Cited

U.S. PATENT DOCUMENTS

| 584,299 | 6/1897 | Weldon | 29/518 |
|---|---|---|---|
| 2,803,695 | 8/1957 | Woolley, Jr. | 29/871 X |
| 3,422,529 | 1/1969 | Nuding . | |
| 3,538,596 | 11/1970 | Davis et al. | 29/872 |
| 3,908,267 | 9/1975 | Loyd et al. | 29/872 |
| 4,268,957 | 5/1981 | Sbuely | 29/871 |
| 4,384,168 | 5/1983 | Kenney | 174/128 S |

FOREIGN PATENT DOCUMENTS

| 1585965 | 2/1970 | France . |
|---|---|---|
| 2397720 | 2/1979 | France . |
| WO80/02084 | 10/1980 | PCT Int'l Appl. . |
| 1073207 | 6/1967 | United Kingdom . |
| 1298068 | 11/1972 | United Kingdom . |

OTHER PUBLICATIONS

Proceedings of the 6th Symposium on Engineering Problems of Fusion Research, Nov. 18-21, 1975, San Diego, Calif., D. N. Cornish et al., "Explosive Joints in NB-TI/CU Composite Superconductors", pp. 106-110.

*Primary Examiner*—Howard N. Goldberg
*Assistant Examiner*—Vernon K. Rising
*Attorney, Agent, or Firm*—Sandler & Greenblum

[57] ABSTRACT

In a process for making a connection between superconductive wires constituted by one or more strands or filaments of superconductive material embedded in a metallic matrix, the metal constituting the matrix is previously eliminated over a certain length of wire, corresponding to the desired zone of contact between the wires, so as to expose the or each strand of these wires. Thereafter the linkage is established between the strands by exerting thereon a strong pressure, cold.

The visible superconductive strands of the two wires are applied, near one another, on a support. A strip of superconductive material is then applied on the visible strands and a sheath made of a material which is a good conductor of electricity is placed around the assembly constituted by the support, the strands of the superconductive wires and the superconductive strip. This assembly is then subjected to a magnetoforming operation provoking crimping of the outer sheath on the support, with crushing of the superconductive strip on the superconductive strands, thus ensuring the electrical connection of the wires with a very low resistance.

3 Claims, 2 Drawing Figures

PROCESS FOR MAKING A CONNECTION BETWEEN SUPERCONDUCTIVE WIRES AND TO A CONNECTION OBTAINED BY THIS PROCESS

BACKGROUND OF THE INVENTION

1. Field of the Invention

The present invention relates to a process for making a connection between superconductive wires and to a connection obtained by this process.

2. Description of Background Information

When a superconductive circuit whose principal characteristic is that of having a zero electrical resistance, is made, linkages between superconductive wires must be made, either to obtain sufficient lengths or for experimental needs. Now, this contact between the superconductive wires which are constituted in a conventional manner by a metallic matrix, for example of bronze or copper, enclosing at least one superconductive strand or filament (made of alloys or mixtures of metals such as niobium titanium or niobium-tin), introduces an appreciable electrical resistance in the circuit and consequently reduces the advantages of the superconductive wires.

In an attempt to obtain a very low contact resistance between superconductive wires, it has already been envisaged to weld these wires by subjecting the strands or filaments of this wire to ionic bombardment in order to clean them, then by spraying an additional material extracted from a target likewise subjected to ionic bombardment, which furnishes welding layer connecting the two wires. Such a process is described in French Pat. No. 2,397,720 which issued from application No. 77 21671 filed July 13, 1977.

Such a process presents the drawback that the residual contact resistance established between the two welded wires is still relatively high, of the order of 10–8 ohm. Such a high resistance consequently limits the use of superconductive coil in permanent mode. Another drawback of the above process is that, to carry it out, it requires a complex and expensive installation for ionic bombardment.

Another known process, such as described in British Pat. No. 1 298 068, consists in "cold welding" the wires by exerting thereon a high pressure by mechanical means or by an explosion. Such a process presents the drawbacks of requiring the use of means which are inconvenient and of not enabling a very low residual contact resistance to be obtained.

SUMMARY OF THE INVENTION

It is an object of the present invention to overcome these drawbacks by providing a process which is easy to carry out and which enables a very low or virtually negligible contact resistance between superconductive wires to be obtained.

To this end, this process for making a connection between superconductive wires constituted by one or more strands or filaments of superconductive material embedded in a metallic matrix, in which the metal constituting the matrix is previously eliminated over a certain length of wire, corresponding to the desired zone of contact between the wires, so as to expose the or each strand of these wires, and the linkage is established between the strands by exerting thereon a strong pressure, cold, further comprises the steps wherein the visible superconductive strands of the two wires are applied, near one another, on a support, a strip of superconductive material is applied on the visible strands, a sheath made of a material which is a good conductor of electricity is placed around the assembly constituted by the support, the strands of the superconductive wires and the superconductive strip, and the assembly thus obtained is then subjected to a magnetoforming operation provoking crimping of the outer sheath on the support, with crushing of the superconductive strip on the superconductive strands, thus ensuring the electrical connection of the wires with a very low resistance.

The visible superconductive strands of the two wires are preferably wound around a mandrel and a sleeve of superconductive material is then placed around this mandrel, this sleeve then being surrounded by the sheath of electrically conducting material.

The process according to the invention offers the advantage of being very easy to carry out since it simply requires the use of a magnetoforming apparatus which localizes the stress exerted at any desired spot. In addition, tests carried out have shown that the contact resistance between conducting wires obtained by this process is less than 10–17 ohm, and this without deterioration of the intrinsic properties of the wires. Furthermore, the critical current of the superconductive wire is not limited in the contact thus obtained.

The process according to the invention as well as the connection obtained by this process may be used whenever a linkage is to be made between superconductive wires. In particular, the applications of the superconductors, in which strong currents are employed (coils, superconductive alternators, superconductive quadrupoles, superconductive storage rings, etc . . .) employ the process according to the invention. By way of example, superconductive permanent magnets may be made by the process according to the invention. In this way, the current of a coil producing 8 teslas and whose self-inductance is of the order of 10 Henrys decreases with a time constant $\tau = L/R$ equal to $10^{18}$ seconds.

BRIEF DESCRIPTION OF THE DRAWINGS

The invention will be more readily understood on reading the following description with reference to the accompanying drawings, in which.

DETAILED DESCRIPTION

Figure 1:
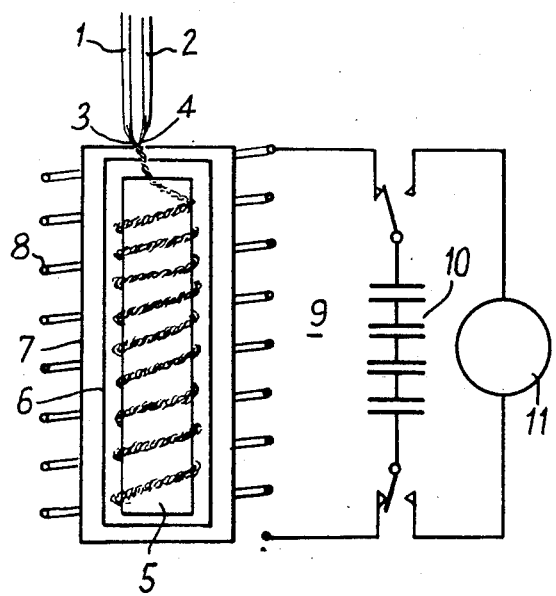
FIG. 1 is a diagram illustrating the execution of the process according to the invention for making a connection between two superconductive wires.

Referring now to the drawings, FIG. 1 shows two superconductive wires 1 and 2 which must be connected to each other with a contact resistance which is as low as possible. Each of these two wires comprises, in known manner, a metallic matrix, for example of bronze or copper, in which are embedded one or more strands or filaments of superconductive material.

To make the connection between the two wires 1 and 2, the metal material constituting the matrix of the wires 1 and 2 is firstly eliminated so as to expose, over a certain length, the superconductive monofilaments of each wire, indicated by references 3 and 4 in FIG. 1. The filaments 3 and 4 thus exposed are then applied, near one another, on a support 5 made of superconductive material or not. In the particular non-limiting case illustrated in FIG. 1, the superconductive monofilaments 3 and 4 are previously twisted before being wound, in close turns, on the support 5 constituting a mandrel of circular or other section.

The mandrel 5 on which the superconductive filaments 3 and 4 are wound and applied, is then surrounded by a fairly fine strip 6 of superconductive material, its thickness being of the order of some microns. In the case illustrated in FIG. 1, the strip 6 constitutes a sleeve surrounding the mandrel 5 and having a diameter slightly larger than the external diameter of said mandrel.

The assembly formed by the mandrel 5 and the superconductive filaments 3 and 4 wound thereon is then placed inside an outer tubular sheath 7 made of a material which is a good conductor of electricity, for example copper. This tubular sheath 7 has a diameter slightly larger than that of the superconducting sleeve 6 and a thickness of the order of one mm. The outer tubular sheath 7 has a length equal to or slightly greater than that of the sleeve 6 and the mandrel 5.

The assembly thus obtained is then subjected to a magnetoforming operation. To this end, the assembly 5, 6, 7 is placed in a solenoid 8 of a magnetoforming apparatus comprising, in conventional manner, a capacitor battery 10 having to be charged by a D.C. source 11 and discharged through the solenoid 8. Discharge of the capacitor battery 10 is translated by the release of very high energy in a very short time (for example 10 kilojoules in some microseconds) and this energy is translated by the production of a very intense magnetic field in the solenoid 8. This magnetic field in turn provokes a transverse necking of the electrically conducting outer sheath 7, in other words a crimping of this sheat 7 on the inner mandrel 5. The sheath 7 is thus crushed and it in turn crushes the intermediate superconductive sleeve 6 on the superconductive filaments 3 and 4 maintained by the central mandrel 5.

Figure 2:
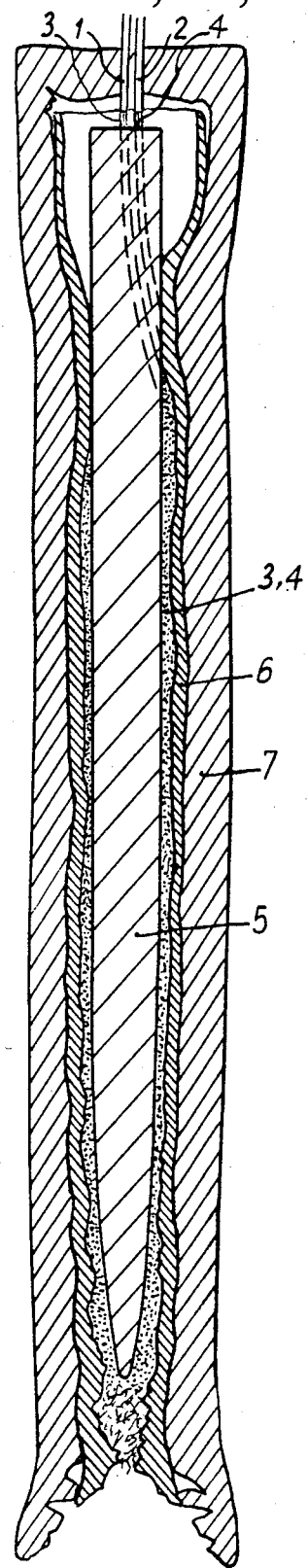
FIG. 2 is a view in axial section of a connection made between two conductive wires by carrying out the process according to the invention.

FIG. 2 shows the connection which is thus obtained by carrying out the process according to the invention. It will be seen that the superconductive filaments 3, 4 are crushed very strongly between the central mandrel 5 and the superconductive sleeve 6.

Due to the intimate contact between the superconductive filaments 3, 4 and between these filaments and the superconductive sleeve 6 which encompasses them, a very low contact resistance is obtained, which, according to tests carried out, is less than 10–17 ohm.

It will be seen from the foregoing description that the process according to the invention is very easy to carry out, since it requires only a magnetoforming apparatus of remarkably simple design.

What is claimed is:

1. Process for making a connection between superconductive wires constituted by one or more strands or filaments of superconductive material embedded in a metallic matrix, in which the metal constituting the matrix is previously eliminated over a certain length of wire, corresponding to the desired zone of contact between the wires, so as to expose the or each strand of these wires, and the linkage is established between the strands by exerting thereon a strong pressure, cold, further comprising the steps wherein the visible superconductive strands of the two wires are applied, near one another, on a support, a strip of superconductive material is applied on the visible strands, a sheath made of a material which is a good conductor of electricity is placed around the assembly constituted by the support, the strands of the superconductive wires and the superconductive strip, and the assembly thus obtained is then subjected to a magnetoforming operation provoking crimping of the outer sheath on the support, with crushing of the superconductive strip on the superconductive strands, thus ensuring the electrical connection of the wires with a very low resistance.

2. A process according to claim 1, wherein the visible superconductive strands of the two wires are wound around a mandrel and a sleeve of superconductive material is then placed around this mandrel, this sleeve then being surrounded by the sheath of electrically conducting material.

3. Connection obtained by the process according to claim 1.

* * * * *